(12) United States Patent
Liu

(10) Patent No.: US 9,721,655 B2
(45) Date of Patent: Aug. 1, 2017

(54) MEMORY CELL HAVING DIELECTRIC MEMORY ELEMENT

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 13/906,964

(22) Filed: May 31, 2013

(65) Prior Publication Data

US 2013/0265822 A1 Oct. 10, 2013

Related U.S. Application Data

(62) Division of application No. 12/352,402, filed on Jan. 12, 2009, now Pat. No. 8,455,855.

(51) Int. Cl.
*H01L 47/00* (2006.01)
*G11C 13/00* (2006.01)
(Continued)

(52) U.S. Cl.
CPC ...... *G11C 13/0009* (2013.01); *G11C 11/5614* (2013.01); *G11C 13/0011* (2013.01); *H01L 27/1021* (2013.01); *H01L 27/24* (2013.01); *H01L 27/2418* (2013.01); *H01L 27/2463* (2013.01); *H01L 45/085* (2013.01);
(Continued)

(58) Field of Classification Search
CPC ............... H01L 45/16; H01L 27/11529; H01L 27/1021; H01L 27/24; H01L 27/2418; H01L 27/2463; H01L 45/085; H01L 45/1233; H01L 45/142; H01L 45/143; H01L 45/145; G11C 11/5614;
(Continued)

(56) References Cited

U.S. PATENT DOCUMENTS 8,455,855 B2 6/2013 Liu
2004/0124407 A1 7/2004 Kozicki et al.
(Continued)

FOREIGN PATENT DOCUMENTS

CN 1144231 A 3/1997
CN 1697195 A 11/2005
(Continued)

OTHER PUBLICATIONS

"Chinese Application Serial No. 201080007404.3, Office Action mailed Jan. 13, 14", w/English Translation, 4 pgs.
(Continued)

*Primary Examiner* — Meiya Li
(74) *Attorney, Agent, or Firm* — Schwegman Lundberg & Woessner, P.A.

(57) ABSTRACT

Some embodiments include apparatus and methods having a memory cell with a first electrode, a second electrode, and a dielectric located between the first and second electrodes. The dielectric may be configured to allow the memory cell to form a conductive path in the dielectric from a portion of a material of the first electrode to represent a first value of information stored in the memory cell. The dielectric may also be configured to allow the memory cell to break the conductive path to represent a second value of information stored in the memory cell.

18 Claims, 13 Drawing Sheets

(51) Int. Cl.
*G11C 11/56* (2006.01)
*H01L 27/102* (2006.01)
*H01L 27/24* (2006.01)
*H01L 45/00* (2006.01)

(52) U.S. Cl.
CPC ........ *H01L 45/1233* (2013.01); *H01L 45/142* (2013.01); *H01L 45/143* (2013.01); *H01L 45/145* (2013.01); *H01L 45/148* (2013.01); *H01L 45/149* (2013.01); *H01L 45/16* (2013.01); *G11C 2213/56* (2013.01); *G11C 2213/72* (2013.01)

(58) Field of Classification Search
CPC ............ G11C 13/0009; G11C 13/0011; G11C 2213/56; G11C 2213/72
USPC ............................................. 438/14, 95, 382
See application file for complete search history.

(56) References Cited

U.S. PATENT DOCUMENTS

| | | | |
|---|---|---|---|
| 2004/0202016 A1* | 10/2004 | Campbell | G11C 11/404 365/159 |
| 2005/0017233 A1 | 1/2005 | Campbell | |
| 2005/0077515 A1* | 4/2005 | Kostylev | H01L 45/00 257/52 |
| 2006/0054950 A1* | 3/2006 | Baek | H01L 27/112 257/295 |
| 2006/0097240 A1 | 5/2006 | Lowrey | |
| 2006/0141713 A1 | 6/2006 | Happ et al. | |
| 2007/0008865 A1* | 1/2007 | Adams et al. | 369/126 |
| 2008/0023685 A1 | 1/2008 | Czubatyj et al. | |
| 2008/0265285 A1 | 10/2008 | Kozicki | |
| 2008/0272360 A1 | 11/2008 | Kozicki | |
| 2009/0298224 A1* | 12/2009 | Lowrey | H01L 27/2481 438/102 |
| 2010/0006813 A1* | 1/2010 | Xi et al. | 257/4 |
| 2010/0123117 A1* | 5/2010 | Sun | H01L 45/085 257/5 |
| 2010/0123542 A1* | 5/2010 | Vaithyanathan | H01L 27/2463 338/20 |
| 2010/0176367 A1 | 7/2010 | Liu | |
| 2012/0088328 A1* | 4/2012 | Phatak | H01L 29/8615 438/104 |
| 2014/0009998 A1* | 1/2014 | Schloss | G11C 11/5685 365/148 |

FOREIGN PATENT DOCUMENTS

| | | |
|---|---|---|
| CN | 1897157 A | 1/2007 |
| CN | 101145600 A | 3/2008 |
| CN | 102318057 A | 1/2012 |
| EP | 2386115 | 11/2011 |
| JP | 2005197634 A | 7/2005 |
| JP | 2006514393 A | 4/2006 |
| JP | 2007157941 A | 6/2007 |
| JP | 2007189087 A | 7/2007 |
| JP | 2008536307 A | 9/2008 |
| KR | 20010032827 A | 4/2001 |
| KR | 1020010110433 A | 12/2001 |
| KR | 20050052394 A | 6/2005 |
| KR | 20050108318 A | 11/2005 |
| KR | 20060088066 A | 8/2006 |
| KR | 1020080018938 A | 2/2008 |
| WO | WO-2006132813 A1 | 12/2006 |
| WO | WO-2008062734 A1 | 5/2008 |
| WO | WO-2010081151 A2 | 7/2010 |
| WO | WO-2010081151 A3 | 7/2010 |

OTHER PUBLICATIONS

"Chinese Application Serial No. 201080007404.3, Response filed Mar. 25, 14 to Office Action mailed Jan. 13, 2014", w/English Claims, 10 pgs.
"Chinese Application Serial No. 201080007404.3, Response filed Jun. 13, 2014 to Telephone Notification dated Jun. 9, 2014", w/English claims, 9 pgs.
"Japanese Application Serial No. 2011-545527, Response filed Jul. 8, 2014 to Office Action mailed Feb. 18, 2014", w/English claims, 21 pgs.
"Chinese Application Serial No. 201080007404.3, Office Action mailed Jan. 13, 2014", w/English Translation, 4 pgs.
"Chinese Application Serial No. 201080007404.3, Office Action mailed Jun. 4, 2013", w/English Translation, 11 pgs.
"Chinese Application Serial No. 201080007404.3, Response filed Mar. 25, 2014 to Office Action mailed Jan. 13, 2014", w/English Claims, 10 pgs.
"Chinese Application Serial No. 201080007404.3, Response filed Oct. 17, 2013 to Office Action mailed Jun. 4, 2013", w/English Translation, 35 pgs.
"European Application Serial No. 10729669.1, Extended European Search Report mailed Jun. 11, 2013", 5 pgs.
"European Application Serial No. 10729669.1, Response filed Jan. 7, 2014 to Extended European Search Report mailed Jun. 11, 2013", 5 pgs.
"Japanese Application Serial No. 2011-545527, Office Action mailed Feb. 18, 2014", w/English Translation, 10 pgs.
Baek, I. G, et al., "Highly scalable nonvolatile resistive memory using simple binary oxide driven by asymmetric unipolar voltage pulses", IEEE International Electron Devices Meeting, 2004. IEDM Technical Digest., (Dec. 31, 2004), 587-590.
"International Application Serial No. PCT/US2010/020773, International Preliminary Report of Patentability mailed Jul. 21, 2011", 6 pgs.
"International Application Serial No. PCT/US2010/020773, Search Report mailed Aug. 3, 2010", 6 pgs.
"International Application Serial No. PCT/US2010/020773, Written Opinion mailed Aug. 3, 2010", 4 pgs.
"Taiwanese Application Serial No. 099100725 Response filed Feb. 17, 2015 to Office Action mailed Jan. 6, 2015", With the English claims, 31 pgs.
"Taiwanese Application Serial No. 099100725, Office Action mailed Nov. 19, 2014", 11 pgs.
"European Application Serial No. 10729669.1, Communication under Rule 71(3) mailed Aug. 5, 2014", 5 pgs.
"Korean Application Serial No. 10-2011-7018704, Office Action mailed May 9, 2016", 5 pgs.
"Korean Application Serial No. 10-2011-7018704, Response filed Jul. 11, 2016 to Office Action mailed May 9, 2016", W/ English Translation Of Claims, 17 pgs.

* cited by examiner

MEMORY CELL HAVING DIELECTRIC MEMORY ELEMENT

PRIORITY APPLICATION

This application is a divisional of U.S. application Ser. No. 12/352,402, filed Jan. 12, 2009, which is incorporated herein by reference in its entirety.

BACKGROUND

Computers and other electronic products usually have a memory device with numerous memory cells that store data and other information. Some conventional memory devices may store information based on the amount of charges on a storage node of the memory cell. Different values of the charge on the storage node may represent different values (e.g., binary values "0" and "1") of the information stored in the memory cell. The storage node usually includes semiconductor material such as silicon. In some applications, the above-mentioned memory devices may be inapplicable because of factors such as size and fabrication process challenges.

DETAILED DESCRIPTION

Figure 1:
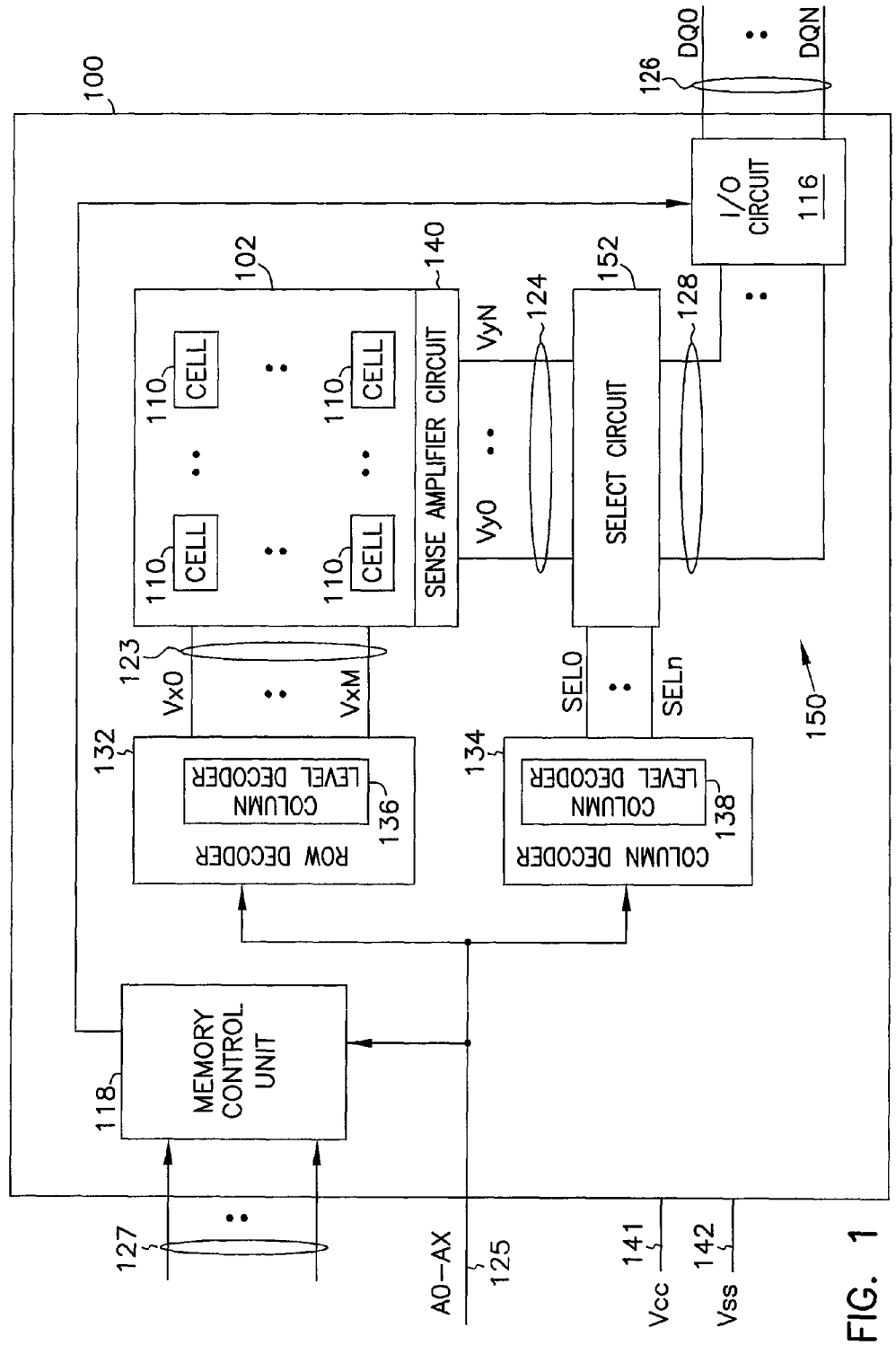
FIG. 1 shows a block diagram of a memory device having a memory array with memory cells, according to an embodiment of the invention.

FIG. 1 shows a block diagram of a memory device 100 having a memory array 102 with memory cells 110, according to an embodiment of the invention. Memory cells 110 may be arranged in rows and columns along with lines 123 (e.g., wordlines having signals Vx0 through VxM) and lines 124 (e.g., bit lines having signals Vy0 through VyN). Memory device 100 may use lines 123 and lines 124 to transfer information within memory cells 110. Memory cells 110 may be physically located on multiple device levels such that one group of memory cells 110 may be stacked on one or more groups of other memory cells 110. Row decoder 132 and column decoder 134 may decode address signals A0 through AX on lines 125 (e.g., address lines) to determine which memory cells 110 are to be accessed. Row and column level decoders 136 and 138 of row and column decoders 132 and 134, respectively, may determine on which of the multiple device levels of device 100 that the memory cells 110 to be accessed are located.

A sense amplifier circuit 140 may operate to determine the value of information read from memory cells 110 and provide the information in the form of signals to lines 123 or lines 124. Sense amplifier circuit 140 may also use the signals on lines 123 or lines 124 to determine the value of information to be written to memory cells 110. Memory device 100 may include circuitry 150 to transfer information between memory array 102 and lines (e.g., data lines) 126. Signals DQ0 through DQN on lines 126 may represent information read from or written into memory cells 110. Other devices external to memory device 100 (e.g., a memory controller or a processor) may communicate with memory device 100 through lines 125, 126, and 127.

Memory device 100 may perform memory operations such as a read operation to read information from memory cells 110 and a write operation (sometime referred to as a programming operation) to write (e.g., program) information into memory cells 110. A memory control unit 118 may control the memory operations based on control signals on lines 127. Examples of the control signals on lines 127 include one or more clock signals and other signals to indicate which operation, (e.g., a write or read operation) that memory device 100 may perform. Other devices external to memory device 100 (e.g., a processor or a memory controller) may control the values of the control signals on lines 127. Specific values of a combination of the signals on the lines may produce a command (e.g., a write or read command) that may cause memory device 100 to perform a corresponding memory operation (e.g., a write or read operation).

Memory device 100 may receive a supply voltage, including supply voltage signals Vcc and Vss, on lines 141 and 142, respectively. Supply voltage signal Vss may operate at a ground potential (e.g., having a value of approximately zero volts). Supply voltage signal Vcc may include an external voltage supplied to memory device 100 from an external power source such as a battery or an alternating-current to direct-current (AC-DC) converter circuitry.

Circuitry 150 of memory device 100 may include a select circuit 152 and an input/output (I/O) circuit 116. Select circuit 152 may respond to signals SEL0 through SELn to select the signals on lines 124 and 128 that may represent the information read from or written into memory cells 110. Column decoder 134 may selectively activate the SEL0 through SELn signals based on the A0 through AX address signals on lines 125. Select circuit 152 may select the signals on lines 124 and 128 to provide communication between memory array 102 and I/O circuit 116 during read and write operations.

Memory device 100 may include a non-volatile memory device and memory cells 110 may include non-volatile memory cells such that memory cells 110 may retain information stored thereon when power (e.g., Vcc or Vss, or both) is disconnected from memory device 100. One skilled in the art may recognize that memory device 100 may include other features that are not shown in FIG. 1, to help focus in the embodiments described herein.

Device 100 may selectively read or write memory cells 110. To write a selected memory cell 110, memory device 100 may apply a write current to or a voltage across the selected memory cell to change the resistance of the selected memory cell. The value of information stored in a memory cell may be based on the value of the resistance of that memory cell. To read a selected memory cell 110, memory device 100 may apply a read current to or a voltage across the selected memory cell and then determine its resistance based on a measured read current or voltage from the selected memory cell to determine the corresponding value of information stored therein.

Memory device 100 may include at least one of the memory devices and memory cells described below with reference to FIG. 2 through FIG. 16.

Figure 2:
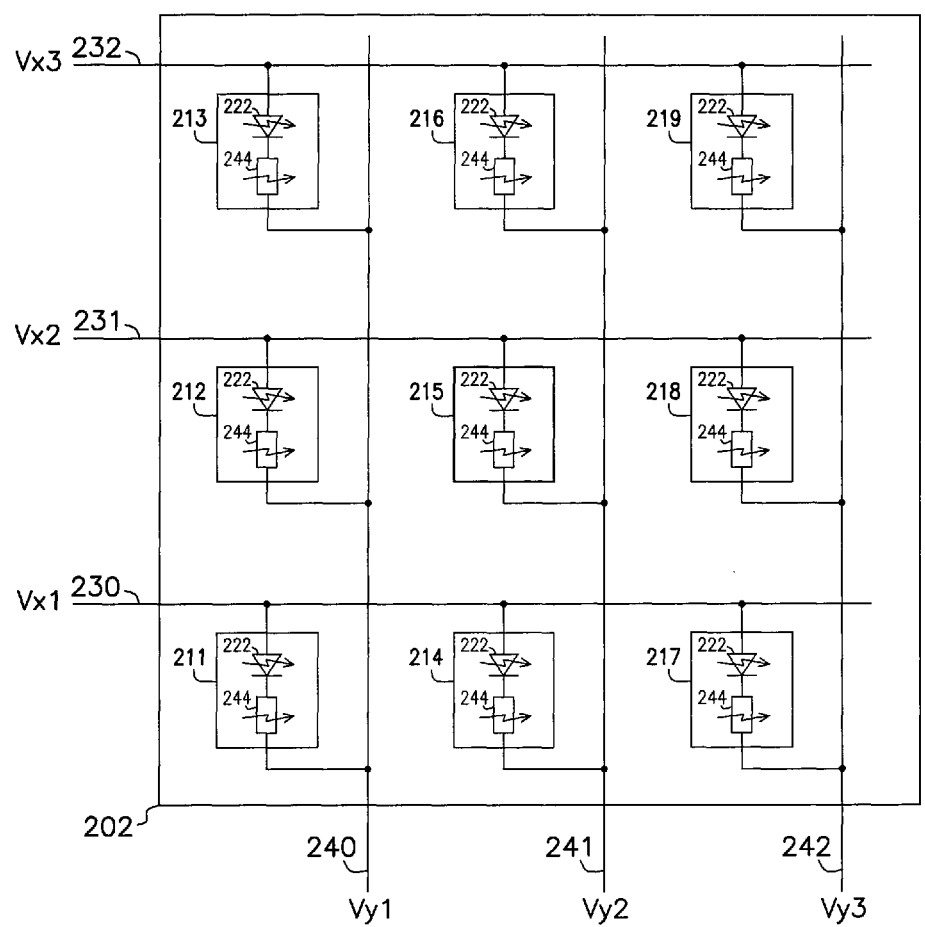
FIG. 2 shows a partial block diagram of a memory device having a memory array including memory cells with memory elements and access components, according to an embodiment of the invention.

FIG. 2 shows a partial block diagram of a memory device 200 having a memory array 202 including memory cells 211, 212, 213, 214, 215, 216, 217, 218, and 219 according to an embodiment of the invention. Memory array 202 may correspond to memory array 102 of FIG. 1. In FIG. 2, memory cells 211 through 219 may couple to data/sense lines 230, 231, and 232 (e.g., bit lines) having signals Vx1, Vx2, Vx3, respectively, and access lines 240, 241, and 242 (e.g., word lines) having signals Vy1, Vy2, and Vy3, respectively. Each of memory cells 211 through 219 may include a memory element 222 and an access component 244 coupled in series between one of lines 230, 231, and 232 and one of lines 240, 241, and 242.

Memory device 200 may program each of memory cells 211 through 219 with different resistances. The value of information stored in a memory cell is based on the value of the resistance of that memory cell. The resistance value in each memory cell depends on the presence or absence (or breakage) of a conductive path through the memory cell.

Figure 3:
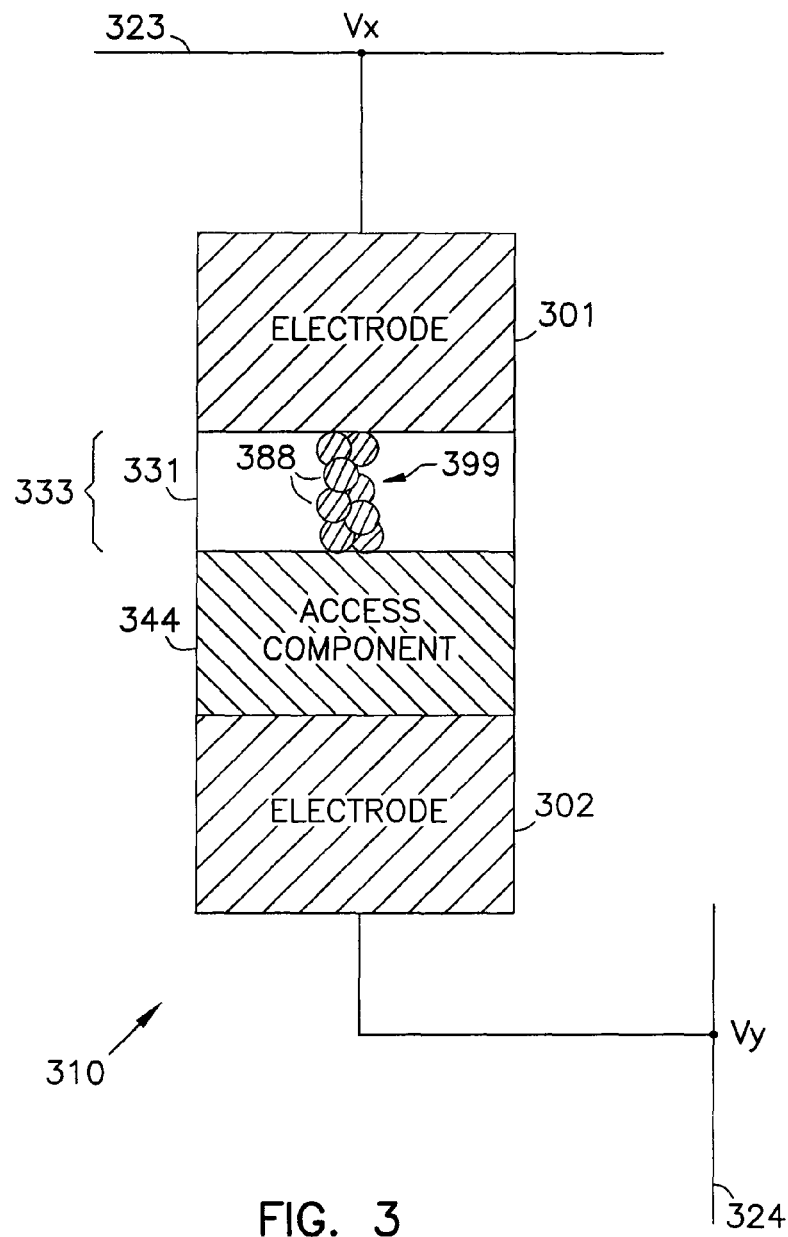
FIG. 3 shows a cross-section of a memory cell with a conductive path, according to an embodiment of the invention.
Figure 4:
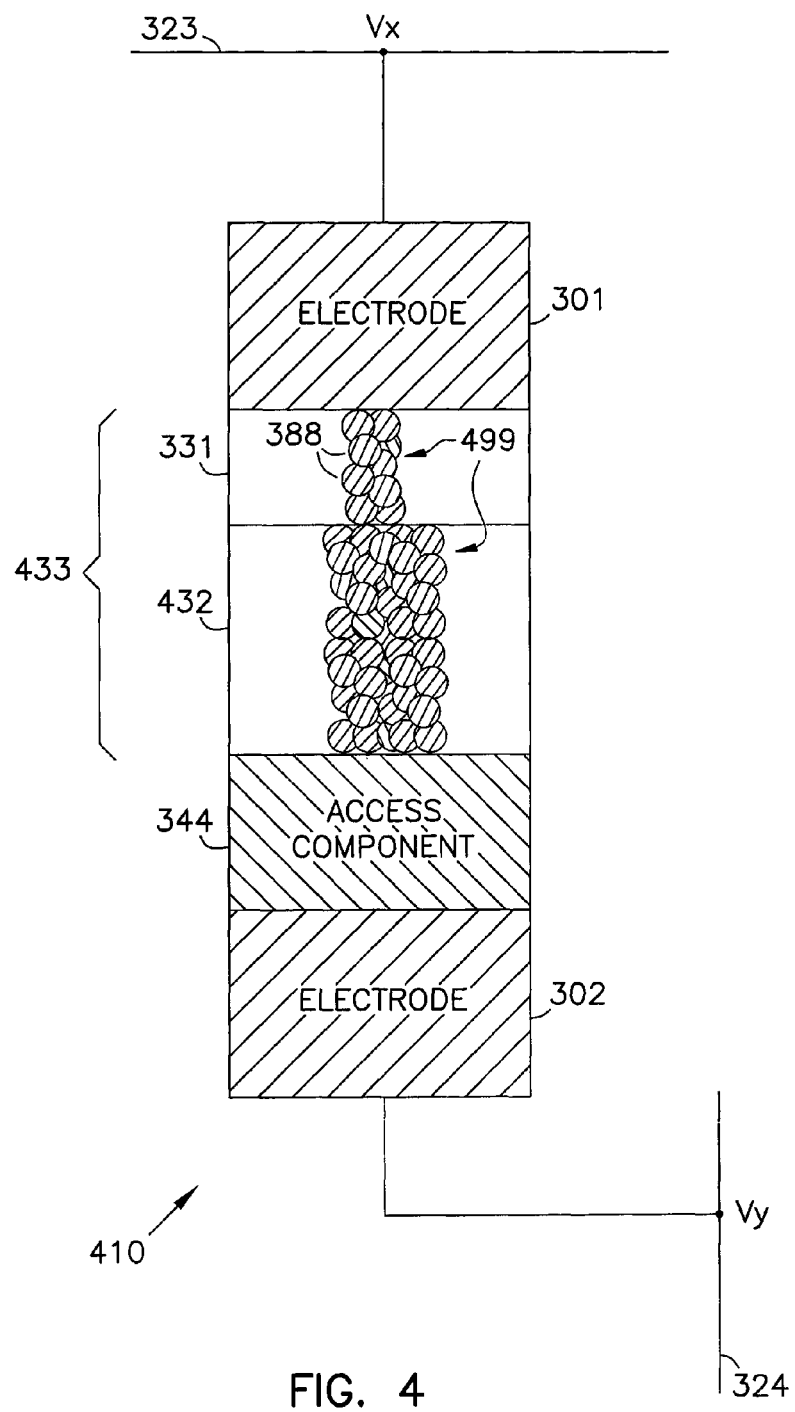
FIG. 4 shows a cross-section of a memory cell with a memory element having a dielectric and an intermediate component, according to an embodiment of the invention.
Figure 6:
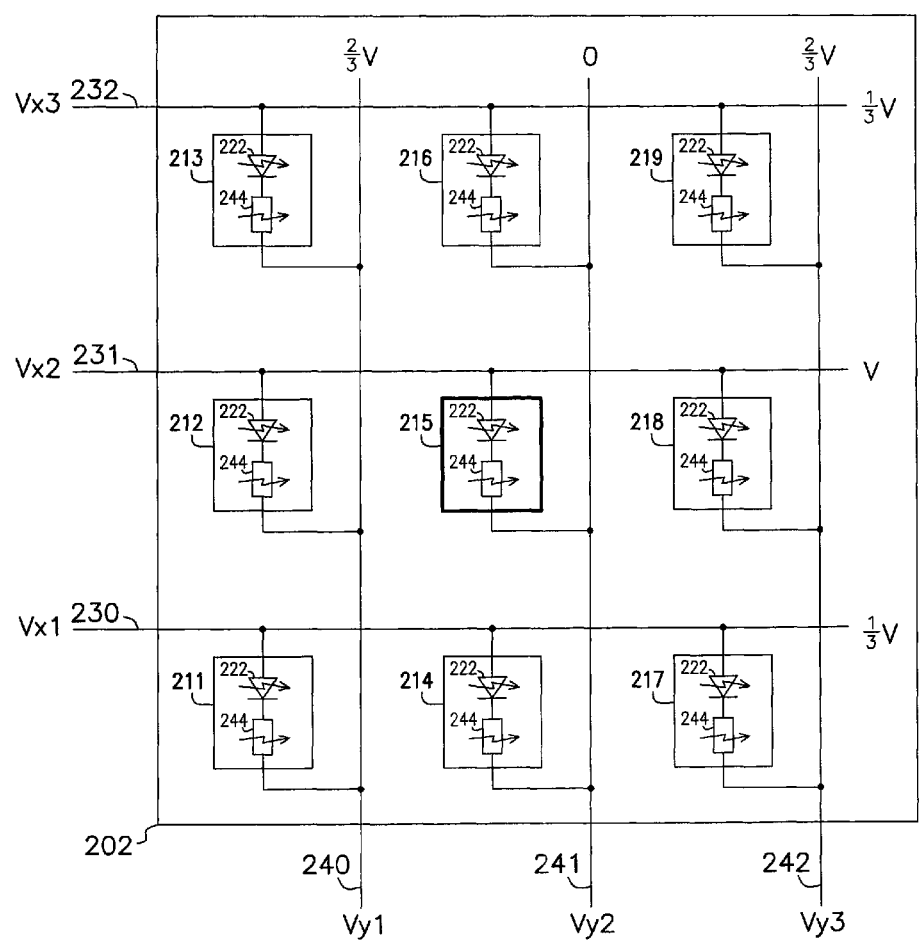
FIG. 6 shows an example of various voltages being applied to memory cells of a memory device during various memory operations of the memory device, according to an embodiment of the invention.
Figure 7:
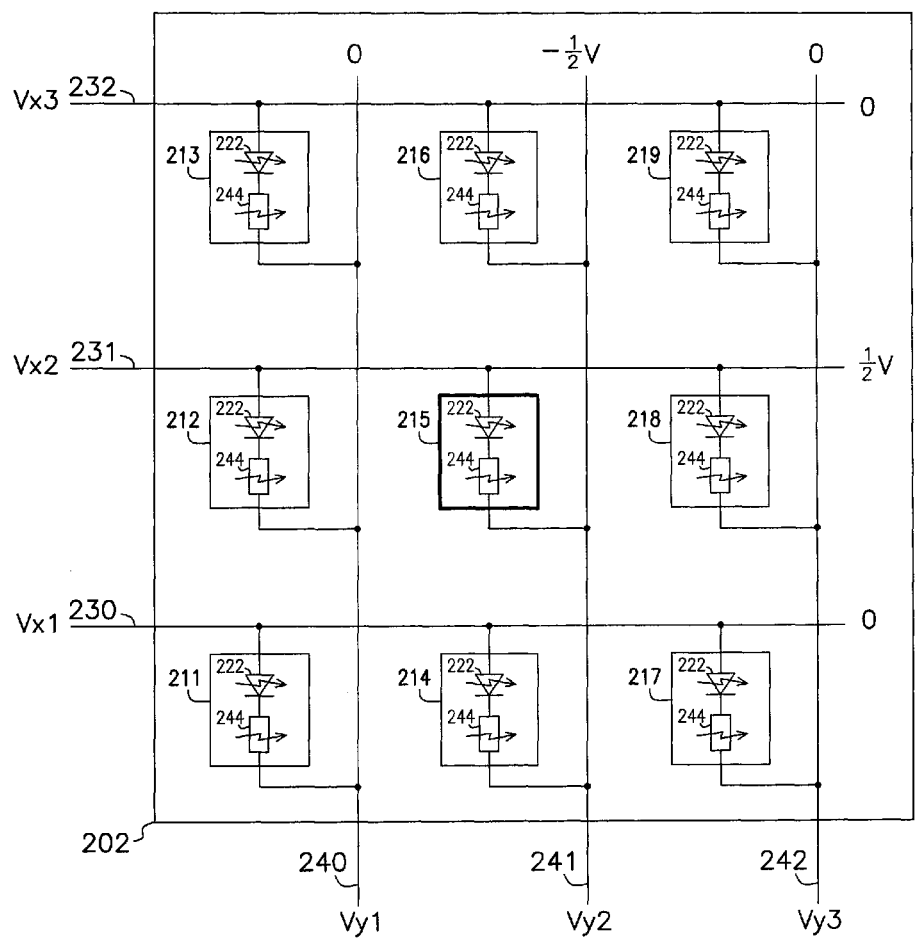
FIG. 7 shows another example of various voltages being applied to memory cells of another memory device during various memory operations of the memory device, according to an embodiment of the invention.

Each memory element 222 may include electrodes in which one of the electrodes may be coupled to one of lines 230, 231, and 232 and the other electrode may be coupled to one of lines 240, 241, and 242. FIG. 3 and FIG. 4 show different examples of memory cells that may be used for memory cells 211 through 219 of FIG. 2. In FIG. 2, depending on the value of information to be stored in a selected memory cell during a write operation, memory device 200 may apply various voltages on lines 230, 231, and 232 and lines 240, 241, and 242 to either form a conductive path or break an existing conductive path in memory element 222 of the selected memory cell. FIG. 6 and FIG. 7 show examples of various voltages being applied to memory cells, such as memory cells 211 through 219, during various memory operations.

In FIG. 2, during a read or write operation, memory device 200 may use appropriate voltage values for signals Vx1, Vx2, Vx3, Vy1, Vy2, and Vy3 to turn on access component 244 of the memory cell that is being selected (selected memory cell) to be read or written, so that memory device 200 may access (e.g., to read or write) the selected memory cell. Memory device 200 may turn off access component 244 of each of the memory cells that is not being selected (unselected memory cell).

For example, in a write operation, memory device 200 may select memory cell 215 to write information into it. In this example, memory device 200 apply a voltage difference (e.g., write voltage) across memory cell 215 to turn on access component 244 of memory cell 215 and to form a conductive path in memory element 222 of memory cell 215. Memory device 200 may also apply a voltage difference with an opposite polarity from the voltage difference that was used to create the conductive path in memory cell 215 to break an existing conductive path in memory element 222 of memory cell 215.

In another example, in a read operation, memory device 200 may select memory cell 215 to read information stored therein. In this example, memory device 200 may apply another voltage difference (e.g., read voltage) across memory cell 215 to turn on access component 244 of memory cell 215. Then, memory device 200 may determine the resistance of memory cell 215 (e.g., resistance of memory cell 215 between lines 231 and 241) based on a measured read current or voltage from memory cell 215 to determine the corresponding value of information stored therein.

In both the write and read examples herein, memory device 200 may turn off access component 244 of each of the unselected memory cells (memory cells 210, 211, 212, 213, 216, 217, 218, and 219) so that memory element 222 of each of the unselected memory cells may remain unaccessed.

The voltage difference (e.g., write voltage) used to write a selected memory cell and the voltage difference (e.g., read voltage) used to read a selected memory cell may have different values, such that the value of the information stored in the selected memory cell remains unchanged after the selected memory cell is read. For example, if a write voltage difference used to write a selected memory cell has a value of two volts, then a read voltage difference used to read a selected memory cell would have a value of less than two volts, so that the read voltage difference is insufficient to write the selected memory cell (e.g., to create a conductive path in the selected memory cell), but sufficient to turn on the access component of the selected memory cell for reading the selected memory cell. The reason for the read voltage difference to be less than the write voltage difference is to allow the value of the information stored in the selected memory cell to remain unchanged after the selected memory cell is read if the selected memory cell has not been written before the selected memory cell is read.

In the examples above, since memory cell 215 is assumed to be the selected memory cell, memory device 200 may use appropriate voltage values for signals Vx2 and Vy2 on lines 231 and 241 (corresponding lines coupled to memory cell 215) so that a voltage difference (e.g., voltage drop) across memory cell 215 may have a sufficient value to turn on access component 244 of memory cell 215. When turned on, access component 244 of memory cell 215 may allow conduction of current (e.g., read or write current) through memory element 222 of memory cell 215 so that memory device 200 may read information from or write information into memory cell 215. For the unselected memory cells, memory device 200 may use appropriate voltage values for signals Vx1, Vx3, Vy1, and Vy3 to keep off (or turn off) access component 244 of each of the unselected memory cells to prevent conduction of current through the unselected memory cells.

Memory cells 211 through 219 may include a memory cell similar to or identical to the memory cell of FIG. 3 or FIG. 4.

FIG. 3 shows a cross-section of a memory cell 310 with a conductive path 399, according to an embodiment of the invention. Memory cell 310 may include electrodes 301 and 302, a memory element 333, and an access component 344. Signals Vx on line 323 of FIG. 3 may correspond to one of signals Vx1, Vx2, and Vx3 of FIG. 2. Signals Vy on line 324 of FIG. 3 may correspond to one of signals Vy1, Vy2, and Vy3 of FIG. 2. As shown in FIG. 3, memory element 333 may include a dielectric 331 between electrodes 301 and 302.

For clarity, the drawings described herein may omit some cross-section lines (parallel diagonal lines) of some features. For example, FIG. 3 omits cross-section lines of a part of dielectric 331.

In FIG. 3, the value of information stored in memory cell 310 may depend on the presence or absence of a conductive path such as conductive path 399 in dielectric 331. For example, with conductive path 399, as shown in FIG. 3, memory cell 310 may store a first value (e.g., logic one or binary one). When conductive path 399 is broken (e.g., discontinuous), memory cell 310 may store a second value (e.g., logic zero or binary zero) different from the first value.

During a write operation, a memory device (where memory cell 310 resides) may apply signals Vx and Vy with voltage values such that a voltage difference in a direction (e.g., first direction) from line 323 to line 324 is a positive voltage value. For example, signal Vx may have a value of V volts, where V represents a real number, and signal Vy may have a value of zero volts. The voltage difference may create a breakdown path (e.g., a channel) in the material of dielectric 331. A portion of the material of electrode 301 may move (e.g., diffuse or drift) into the breakdown path in dielectric 331 to create conductive path 399. For example, ions 388 (e.g., positively charged ions) of the material of electrode 301 may move into the breakdown path to create conductive path 399. Since conductive path 399 may be created by ions from electrode 301, conductive path 399 may include an ionic conductive path.

To break conductive path 399, the memory device may apply signals Vx and Vy with voltage values such that a voltage difference in a direction from line 323 to line 324 is a negative value, meaning that a voltage difference in a direction (e.g., second direction) from line 324 to line 323 is a positive voltage value. For example, to break conductive path 399, signal Vx may have a value of zero volts, and signal Vy may have a value of V volts. The negative voltage difference may create a negative electric field and cause the material of electrode 301 in conductive path 399 to move from memory element 333 back to electrode 301. As a result, conductive path 399 may break or become discontinuous.

As shown in FIG. 3, the entire memory element 333 may include only dielectric 331. Thus, before a conductive path, such as conductive path 399, forms in memory element 333, the material of memory element 333 may include only the material of dielectric 331. Examples of the material for dielectric 331 include $Al_xO_y$, MgO, AlN, SiN, $CaO_x$, $NiO_x$, $HfO_2$, $Ta_2O_5$, $ZrO_2$, $NiMnO_x$, $MgF_2$, SiC, $SiO_xN_y$, $HfO_x$, $Nb_2O_5$, $WO_x$, $TiO_x$, $ZrO_x$, and $Cu_xO$, among others. In these compositions, "x" and "y" represent a relative amount of a corresponding component element in a material composition. Some of the material compositions in this entire description list only the component elements. However, the relative amount of each component element in each of these material compositions is not limited to a particular value.

In memory cell 310 of FIG. 3, electrode 301 includes a conductive material with fast diffusivity. Examples of the material for electrode 301 include Ag, Cu, and Au.

In the above example materials for memory element 333 and electrode 301, SiN may be chosen over the other material as the material for dielectric 331 because SiN is impervious to Ag (or Cu or Au), such that after Ag (or Cu or Au) is present inside the breakdown path, the Ag (or Cu or Au) does not easily diffuse into other areas surrounding the breakdown path. Further, SiN may be chosen because it provides good electrical insulation between electrodes 301 and 302.

In the above example materials for electrode 301, Ag may be chosen over Cu or Au because Ag has a faster diffusivity than Cu or Au ions. Further, Ag may be chosen because it provides a good conductive filament or conductive path, such as conductive path 399 of FIG. 3.

FIG. 3 shows electrode 302 as a single component. However, electrode 302 may include multiple components, such as a metal and an additional material such as a refractory metal nitride, carbide, or boride. Examples of the material of electrode 302 include refractory metal nitride, carbides and borides such as TiN, ZrN, HfN, VN, NbN, TaN, TiC, ZrC, HfC, VC, NbC, TaC, $TiB_2$, $ZrB_2$, $HfB_2$, $VB_2$, $NbB_2$, $TaB_2$, $Cr_3C_2$, $Mo_2C$, WC, $CrB_2$, $Mo_2B_5$, $W_2B_5$; compounds such as TiAlN, TiSiN, TiW, TaSiN, TiCN, SiC, $B_4C$, $WSi_x$, $MoSi_2$; metal alloys such as NiCr; and elemental materials such as doped silicon, carbon, platinum, niobium, tungsten, molybdenum.

Figure 5A:
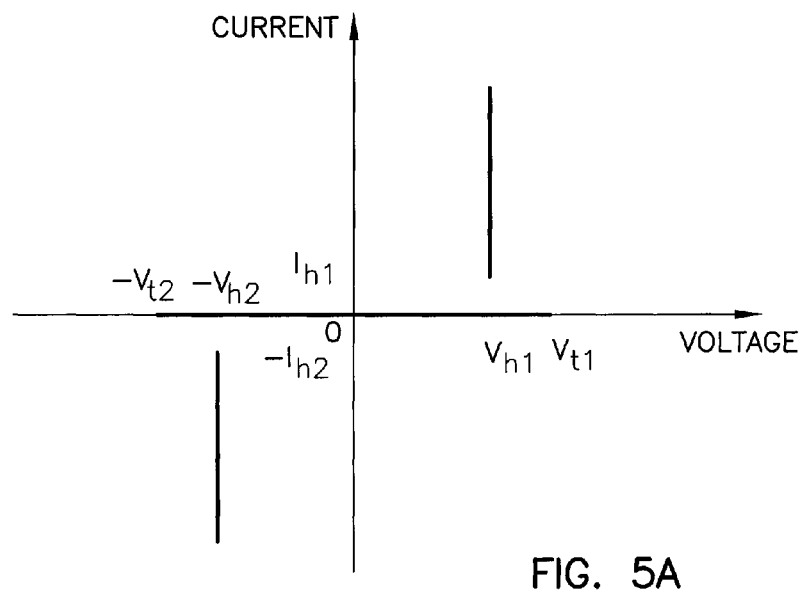
FIG. 5A and FIG. 5B are example embodiments illustrating graphs of current versus voltage (I-V) characteristics of an access component of the memory cell of FIG. 3 and FIG. 4.
Figure 5B:
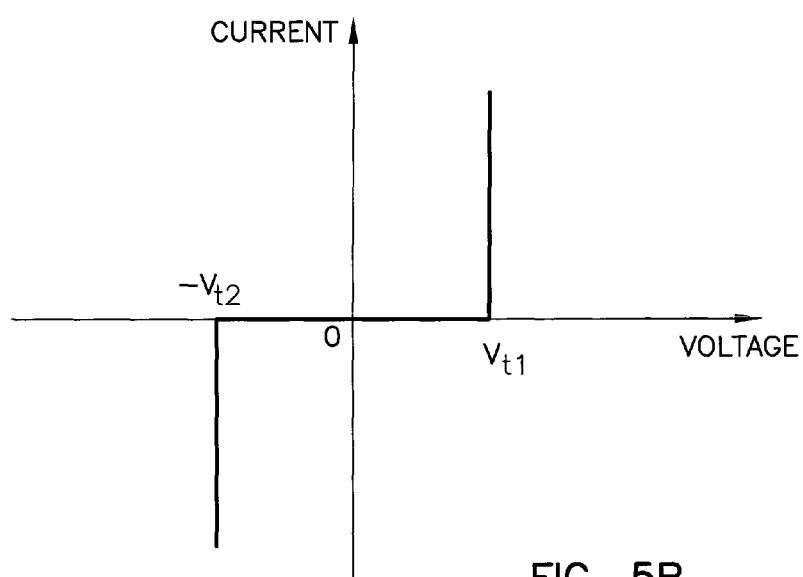

In FIG. 3, as described above, memory cell 310 may turn on (or keep off) access component 344 to allow (or prevent) access to memory element 333 during a read or write operation. Access component 344 may have an on-state and an off-state. Access component 344 has a higher resistance in the off-state to prevent conduction of current and a lower resistance in the on-state to allow conduction of current. Access component 344 may switch between the off-state (e.g., higher resistance) and the on-state (e.g., lower resistance) based on the voltage values of signals Vx and Vy. For example, a difference in voltage values (e.g., voltage potentials) between signals Vx and Vy may be set to a positive value with respect to line 323 to switch access component 344 to the on-state when memory cell 310 is selected to be read or written. The difference in voltage values between signals Vx and Vy may be set to a negative value with respect to line 323 when memory cell 310 is not selected to be read or written. FIG. 5A and FIG. 5B are example embodiments illustrating graphs of current versus voltage (I-V) characteristics of access component 344 of the memory cell 310 of FIG. 3.

In FIG. 3, access component 344 may include a chalcogenide material. Examples of the materials for component 344 include As—Te—I, $TiAsSe_2$, $TiAsTe_2$, Si—Te—As—Ge, Si—Te—As—Ge—P, Al—As—Te, Al—Ge—As—Te, $Te_{39}As_{36}Si_{17}Ge_7P$, $As_{40}Te_{(60-x)}In_x$ (5<x<16.5), $As_{35}Te_{(65-x)}In_x$ (12.5<x<21.5), $As_{30}Te_{(70-x)}In_x$ (12.5<x<21.5), $Ge_{20}Te_{(80-x)}Pb_x$ (2<x<8). Alternatively, access component 344 may include metal-insulator-metal (MIM) diodes that can provide bi-polarity rectification. In this description, the insulator in the MIM diode can include a single insulation material or multiple different insulation materials. For example, access component 344 may include an MIM diode, such as a $TaSiN/SiO_2/ZrO_2/Pt$ stack, a $TaSiN/Ta_2O_5/ZrO_2/Pt$ stack, a $TaSi/ZrOx/TiN$ stack, a $TaSiN/ZrOx/TiN$ stack, and a $TaSi/SiO_2/ZrO_2/Pt$ stack.

Memory cell 310 may be configured as a one-time programmable memory to permanently store one value of information. Alternatively, memory cell 310 may be configured such that it may be used as a multiple-time programmable memory (e.g., flash memory) to store information with one value at one time and another value at another time.

FIG. 4 shows a cross-section of a memory cell 410 with a memory element 433 having a dielectric 331 and an intermediate component 432, according to an embodiment of the invention. Memory cell 410 may include features that are similar to those of memory cell 310 of FIG. 3, except for the addition of intermediate component 432 in memory element 433 of FIG. 4. For simplicity, similar features in both memory cells 310 (FIG. 3) and 410 (FIG. 4) are given the same reference number.

FIG. 4 also shows a conductive path 499 including one conductive portion in dielectric 331 and another conductive portion in intermediate component 432. Conductive path 499 is formed from a portion of the material of electrode 301 in ways similar to that of conductive path 399. For example, a memory device (where memory cell 410 resides) may apply signals Vx and Vy with voltage values such that a voltage difference in a direction from line 323 to line 324 is a positive value. The voltage difference may create a breakdown path in the material of dielectric 331. A portion of the material (e.g., ions) of electrode 301 may move into the breakdown path to create one conductive portion conductive path 499. The voltage difference may also cause the portion of the material of electrode 301 to move into intermediate component 432 and form another conductive portion conductive path 499.

When memory cell 410 is used as a multiple-time programmable memory, the conductive portion in the dielectric 331 of conductive path 499 should be capable of being broken (e.g., erased in an erase operation). Therefore, the component (e.g., the access component or the material between dielectric 331 and the access component) next to dielectric 331 should be a blocking component that does not allow the material of electrode 301 (e.g., Ag ions) to flow through and does not provide ions to the conductive path 499. Under the negative electric field, the material of electrode 301 that forms conductive path 499 can be forced out of dielectric 331 to break conductive path 499.

When memory cell 410 is used as a one-time programmable memory, conductive path 499 is permanent in dielectric 331 and at least a portion of intermediate component 432 is stuffed with the material of electrode 301 (e.g., Ag ions) and provides a permanent conductive path. Thus, when memory cell 410 is used as a one-time programmable memory it may be advantageous to add intermediate component 432, as shown in FIG. 4, so that the material of electrode 301 may also migrate through the conductive portion of conductive path 499 in dielectric 331 and provide a substantial amount of the material of electrode 301 in intermediate component 432. The presence of the material of electrode 301 in intermediate component 432 may provide ions to conductive path 499 and prevent the ions in conductive path 499 from being lost.

Intermediate component 432 may include a chalcogenide material. Examples of chalcogenide materials include Ge—Se, Ge—S, Sn—Se, Sn—S, As—Se, As—S, Pb—Se, Pb—S, Hg—Se, Hg—S, AdSICs, $KAg_4I_5$, $RbAg_4I_5$, silver selenide (e.g., Ag—Se), silver sulfide (Ag—S), tin selenide (Sn—Se), Sn—S, Cu—Se, and Cu—S.

In the above example materials for intermediate component 432, Ge—Se or Ag—Se may be chosen over the other materials because Ag-Se is a good superionic conductor and Ag ions can move fast in this material.

FIG. 5A and FIG. 5B are example embodiments illustrating graphs of I-V characteristics of access component 344 of FIG. 3 and FIG. 4. As shown in FIG. 5A, access component 344 is capable of switching (allowing current to flow through it) at both voltage polarities, such that access component 344 may be called a bi-polarity switching component or bi-polarity rectifying component. Access component 344 may have an on-state (e.g., lower resistance) if a voltage difference across it in a first direction exceeds a first threshold voltage $V_{t1}$ of access component 344. The first direction may correspond to a direction from line 323 to line 324 in FIG. 3 or FIG. 4. In FIG. 5A, after the access component 344 is in the on-state, it may remain in the on-state if a minimum holding current $I_{h1}$ or a constant holding voltage $V_{h1}$ is maintained across access component 344. Access component 344 may switch to an off-state if current falls below the holding current $I_{h1}$ or the voltage difference across it falls below the holding voltage $V_{h1}$.

As mentioned above, access component 344 is capable of switching at both voltage polarities. As shown in FIG. 5A, access component 344 may also have an on-state if a voltage difference across it with respect to the first direction is less than a second threshold voltage $V_{t2}$. In other words, access component 344 may also have an on-state if a voltage difference across it with respect to a second direction exceeds (greater than) a voltage $V_T$, where $V_T=-V_{t2}$ ($V_T$ is a positive value because $V_{t2}$ is less than zero or a negative value, as show in FIG. 5A). The second direction may correspond to a direction from line 324 to line 323 (FIG. 3 or FIG. 4). In FIG. 5A, access component 344 may remain in the on-state if a minimum holding current $I_{h2}$ or a constant holding voltage $V_{h2}$ is maintained across access component 344, with respect to the second direction. Threshold voltages $V_{t1}$ and $V_{t2}$ may have different absolute values. Holding currents $I_{h1}$ and $I_{h2}$ may also have different absolute values. Similarly, holding voltages $V_{h1}$ and $V_{h2}$ may also have different absolute values. Access component 344 of FIG. 3 and FIG. 4 may also have I-V characteristics shown in FIG. 5B.

Access component 344 may have a material described above with reference to FIG. 3, such that the material may remain at the same phase in both the on-state and off-state of access component 344. Thus, access component 344 is electronically switching in nature, such that no crystallization or melting occurs in its material in the on-state or off-state.

FIG. 6 shows an example of various voltages being applied to memory cells 211 through 219 during various memory operations of a memory device 600, according to an embodiment of the invention. Memory device 600 includes components similar to or identical to those of memory device 200 of FIG. 2. Thus, similar components in both memory devices 200 and 600 are given the same reference numbers.

Memory device 600 may select memory cells 211 through 219 using signals Vx1, Vx2, and Vx3 on lines 230, 231, and 232 (e.g., bit lines), respectively, and signals Vy1, Vy2, and Vy3 on lines 240, 241, and 242 (e.g., word lines), respectively. During a read or write operation, memory device 600 may use appropriate voltage values of signals Vx1, Vx2, and Vx3 and Vy1, Vy2, and Vy3 to turn on the access component of a selected memory cell that is to be read or written and turn off the access components of the unselected memory cells.

FIG. 6 shows example voltage values of 0 volts, (⅓)V volts, and (⅔)V volts. In FIG. 6 (and also in FIG. 7), V does not mean unit "volt" or "volts". Rather, V represents a positive real number (e.g., one, two, three, or other). Thus (⅓)V volts means one, two, or three volts if the value of V is three, six, or nine, respectively. The example of FIG. 6 assumes that access component 244 of each of the memory cells is in an off-state, and that memory device 600 selects to access memory cell 215 to either read or write memory cell 215. As shown in FIG. 6, memory device 600 may selectively use voltage values of 0 volts, (⅓)V volts, and (⅔)V volts for signals Vx1, Vx2, Vx3, Vy1, Vy2, and Vy3, so that memory device 600 may turn on access component 244 of memory cell 215 (and then apply a read or write current through memory element 222) and keep access component 244 of each of the other memory cells in the off-state.

With the voltage values shown in FIG. 6, the voltage difference from line 231 to line 241 across access component 244 of selected memory cell 215 is V volts (V−0=V), and the voltage difference across access component 244 of each unselected memory cell (cells 211 through 219, except cell 215) is either (⅓)V volts or −(⅓)V volts (negative ⅓ V volts). If each access component 244 only turns on (e.g., conducts current) when the voltage difference between two corresponding lines (e.g., from a corresponding bit line to a corresponding word line) is greater than (⅓)V volts, then all of the unselected access components 244 would turn off (not conduct) and only the selected access component 244 would turn on.

In the above example, V would have a value such that the voltage difference V−0 (V minus zero) is sufficient to write (e.g., create a conductive path in) selected memory cell 215 if memory cell 215 is selected to be written. If memory cell 215 is selected to be read, then V would have a value such that the voltage difference V−0 is sufficient to turn on access component of memory cell 215 for reading it, but is insufficient to write memory cell 215, so that the value of the information stored in memory cell 215 can remain unchanged after it is read.

As described above, a voltage with an opposite polarity may be applied to the selected memory cell to change (e.g., erase) the value of information in the selected memory cell. In FIG. 6, for example, to change the value of information in the selected memory cell 215 after a conductive path is formed in memory cell 215, the voltages on lines 231 and 241 would be switched. For example, 0 volts would be applied to line 231 and V volts would be applied to line 241 while (⅓)V is changed to (⅔)V and (⅔)V is changed to (⅓)V. Thus, the voltage difference across selected cell 215 would be positive V volts in the direction from line 241 to line 231 or negative V volts in the direction from line 231 to line 241. This negative voltage value would disturb a conductive path (e.g., conductive path 399 of FIG. 3 or 499 of FIG. 4) and cause it to break, thereby changing the value of information stored in selected memory cell 215.

In FIG. 6, the voltage values of 0 volts, (⅓)V volts, and (⅔)V volts are used only for ease of describing the example. Memory device 600 may use other voltage values such that the voltage difference in the direction from memory element 222 to access component 244 in each memory cell is at an appropriate value to turn on access component 244 of the selected memory cell and to turn off access component 244 of the unselected memory cells.

FIG. 7 shows another example of various voltages being applied to memory cells 211 through 219 during various memory operations of a memory device 700, according to an embodiment of the invention. Memory device 700 includes components similar to or identical to those of memory device 200 of FIG. 2. Thus, similar components in both memory devices 200 and 700 are given the same reference numbers.

FIG. 7 shows example voltage values of 0 volts, (½)V volts, and −(½)V volts. Like FIG. 6, the following example assumes that access component 244 of each of the memory cells is in an off-state, and that memory device 700 selects to access memory cell 215 to either read or write memory cell 215. With the voltage values shown in FIG. 7, the voltage difference across from line 231 to line 241 access component 244 of selected memory cell 215 is V volts ((½)V−(−(½)V)=V), and the voltage difference across access component 244 of each unselected memory cell (cells 211 through 219, except cell 215) is either (½)V volts or 0 volts. If each access component 244 only turns on when the voltage difference between two corresponding lines (e.g., from a corresponding bit line to a corresponding word line) is greater than (½)V volts, then all of the unselected access components 244 would turn off and only the selected access component 244 would turn on.

In the above example, V would have a value such that the voltage difference (½)V−(−(½)V) is sufficient to write (e.g., create a conductive path in) selected memory cell 215 if memory cell 215 is selected to be written. If memory cell 215 is selected to be read, then V would have a value such that the voltage difference (½)V−(−(½)V) is sufficient to turn on access component of memory cell 215 for reading it, but is insufficient to write memory cell 215, so that the value of the information stored in memory cell 215 can remain unchanged after it is read.

In FIG. 7, to change the value of information in the selected memory cell 215 after a conductive path is formed in memory cell 215, −(½)V volts would be applied to line 231 and (½)V volts would be applied to line 241 while the voltage on each of lines 230, 232, 240, and 242 would may remain the same at 0 volts. Thus, the voltage difference across selected cell 215 would be positive V volts in the direction from line 241 to line 231 or negative V volts in the direction from line 231 to line 241. This negative voltage value would disturb a conductive path (e.g., conductive path 399 of FIG. 3 or 499 of FIG. 4) and cause it to break, thereby changing the value of information stored in selected memory cell 215.

Figure 8:
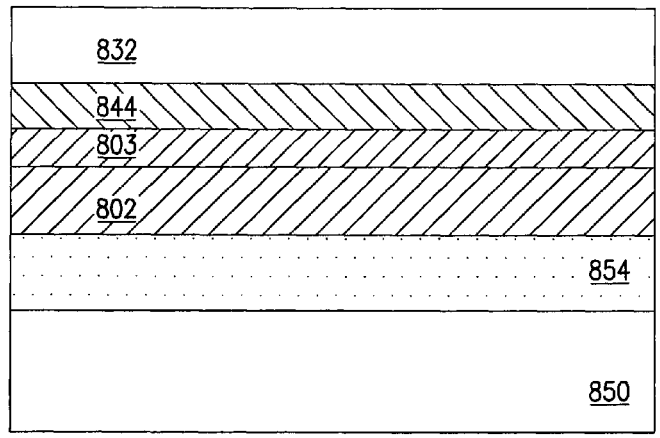
FIG. 8 through FIG. 16 show various processes of forming a memory device, according to an embodiment of the invention.
Figure 9:
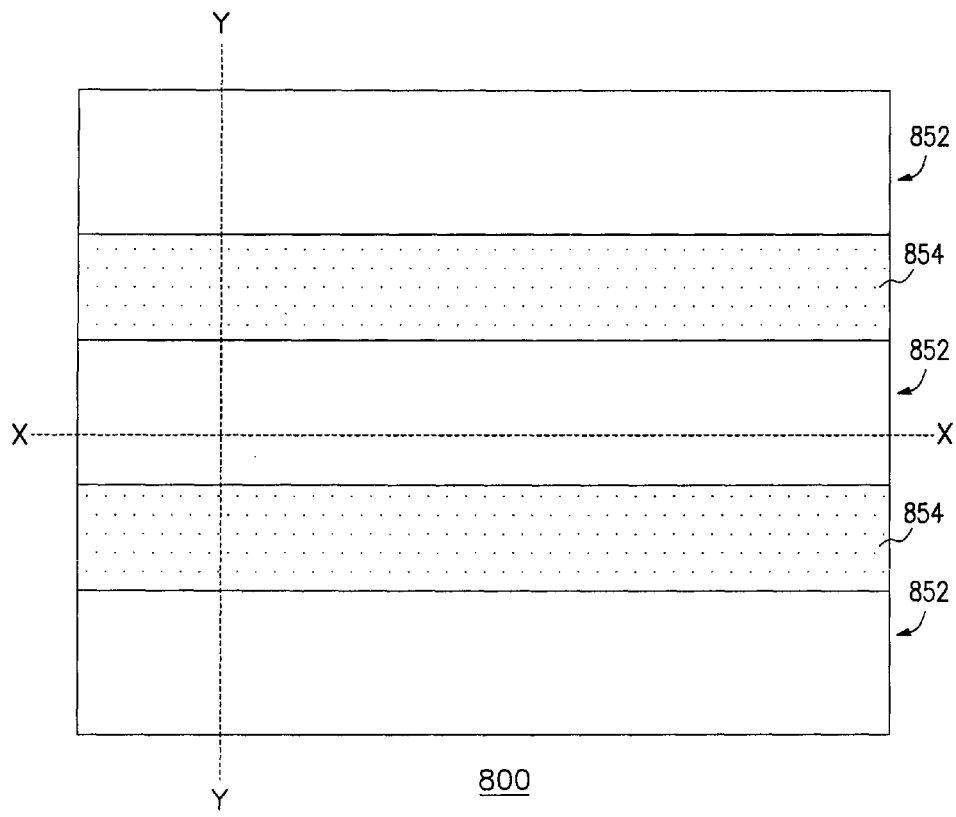
Figure 10:
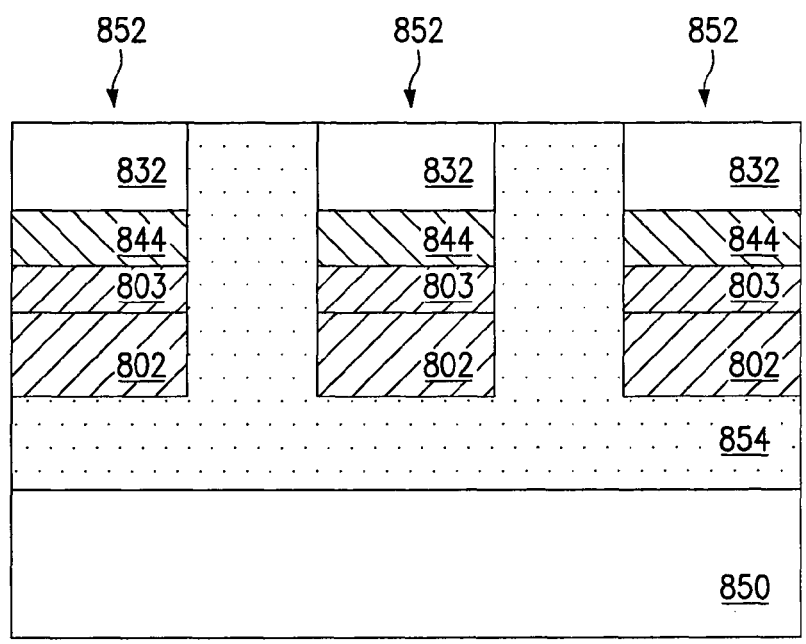

FIG. 8 through FIG. 16 show various processes of forming a memory device 800, according to an embodiment of the invention. FIG. 8 shows a cross section of memory device 800 after multiple components 854, 802, 803, 844, and 832 have been formed over a substrate 850. FIG. 9 shows a top view of memory device 800 with an X-direction line and a Y-direction line, which is perpendicular to the X-direction line. The cross sections of memory device 800 in FIG. 8 is taken along the X-direction in FIG. 9. FIG. 10 shows another cross section of memory device 800 taken along the Y-direction of FIG. 9. For clarity, FIG. 8 through FIG. 16 omit some cross-section lines (parallel diagonal lines) of some features, such as omitting cross-section lines of component 832 in FIG. 8 and FIG. 10.

Forming components 802, 803, 844, and 832 may include depositing multiple materials for components 802, 803, 844, and 832 over the material (e.g., $SiO_2$) of component 854 and substrate 850, patterning (e.g., etching) the multiple materials to form strips 852, and depositing additional insulting material (e.g., $SiO_2$) between strips 852 to insulate them from each other to obtain memory device 800 with the structure as shown in FIG. 8, FIG. 9, and FIG. 10. Patterning the multiple materials to form strips 852 may be performed in the same patterning process. For example, the patterning process to form strips 852 may include placing a patterned mask or photoresist with openings running along the Y-direction (FIG. 15) over the materials components 854, 802, 803, 844, and 832, and then etching the materials through the openings to form strips 852.

As used herein, the term "on" used with respect to two or more materials (or components), one "on" the other, means at least some contact between the materials, while "over" means the materials (or components) are in close proximity, but possibly with one or more additional intervening materials (or components) such that contact is possible but not required. Neither "on" nor "over" implies any directionality as used herein unless stated as such.

In FIG. 8, components 802 and 803 together may form an electrode of a memory cell, such as electrode 302 of FIG. 3 and FIG. 4. Thus, the material of components 802 and 803 may include the materials of electrode 302 of FIG. 3 and FIG. 4. For example, the material of component 802 may include metal and the material of component 803 may include TiN.

Component 844 of FIG. 8 may form an access component of a memory cell, such as access component 344 of FIG. 3 and FIG. 4. Thus, the material of component 844 may include the materials of access component 344 of FIG. 3 and FIG. 4.

Component 832 of FIG. 8 may form an intermediate component of a memory cell, such as intermediate component 432 of FIG. 4. Thus, the material of component 832 of FIG. 8 may include the materials of intermediate component 432 of FIG. 4. For example, the material of component 832 may include Ge-Se or Ag-Se.

Figure 11:
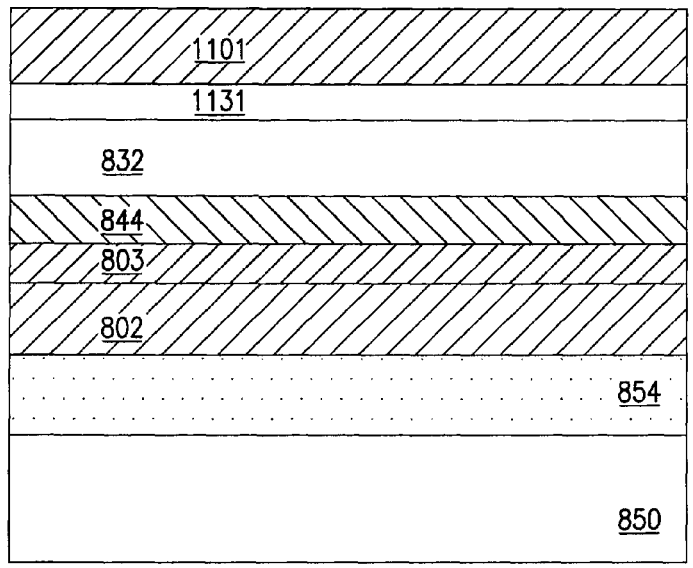
Figure 12:
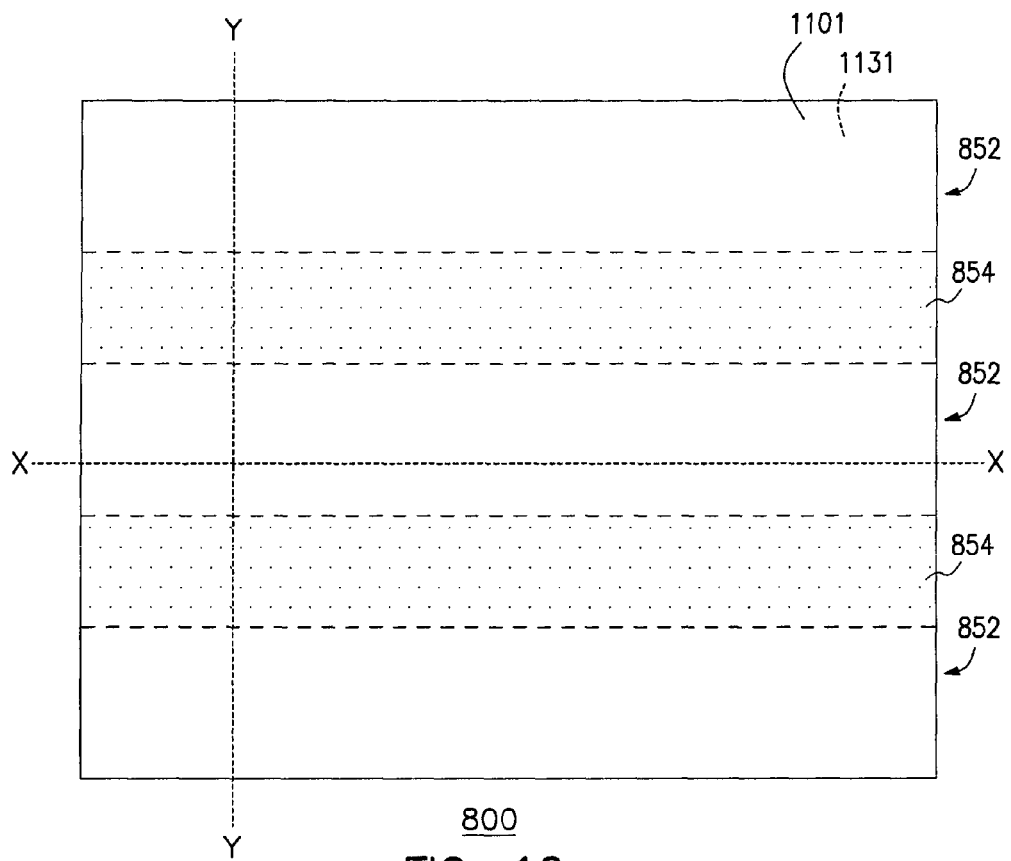
Figure 13:
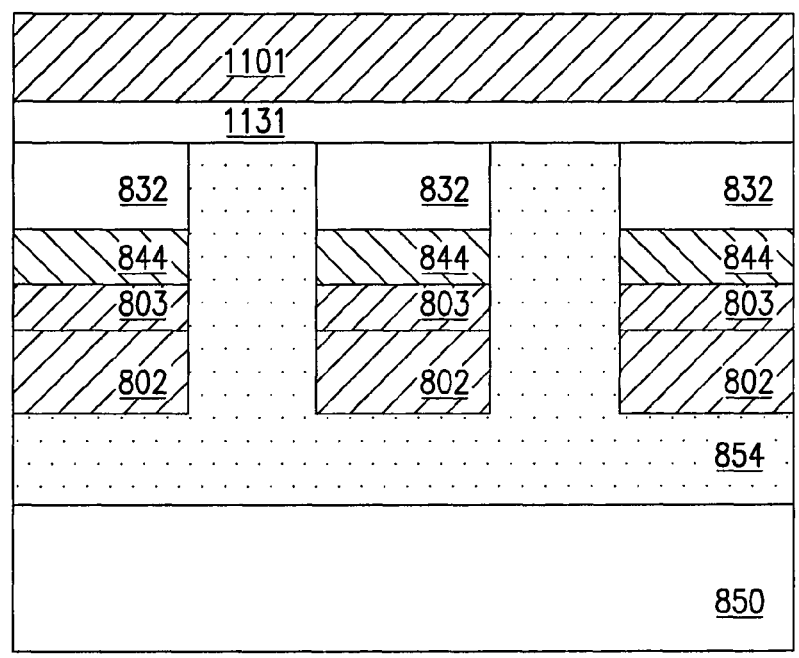

FIG. 11 shows a cross section of memory device 800 after additional components 1131 and 1101 have been formed over components 854, 802, 803, 844, and 832. FIG. 12 shows a top view of memory device 800 including component 1131 and component 1101 under component 1131. The cross section of memory device 800 in FIG. 11 is taken along the X-direction in FIG. 12. FIG. 13 shows another cross section of memory device 800 taken along the Y-direction of FIG. 12. For clarity, FIG. 11 through FIG. 16 omit some cross-section lines of some features, such as omitting cross-section lines of component 1131 in FIG. 11 and FIG. 13. Forming components 1131 and 1101 may include depositing different materials over the materials of components 854, 802, 803, 844, and 832. For example, a material for component 1131 may be deposited over the materials of components 854, 802, 803, 844, and 832. Then, a material for component 1101 may be deposited over the materials of components 1131, 802, 803, 844, and 832.

Component 1131 may form a dielectric of a memory cell, such as dielectric 331 of FIG. 3 and FIG. 4. Thus, the material of component 1131 may include the materials of dielectric 331 (e.g., SiN) of FIG. 3 and FIG. 4.

Component 1101 may form an electrode of a memory cell, such as electrode 301 of FIG. 3 and FIG. 4. Thus, the material of electrode 1131 may include the materials of electrode 301 (e.g., Ag) of FIG. 3 and FIG. 4.

Figure 14:
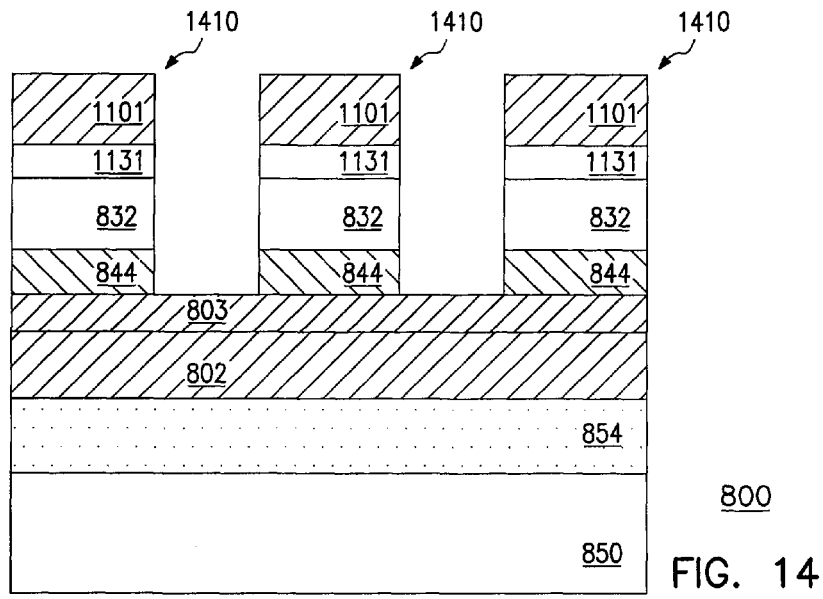
Figure 15:
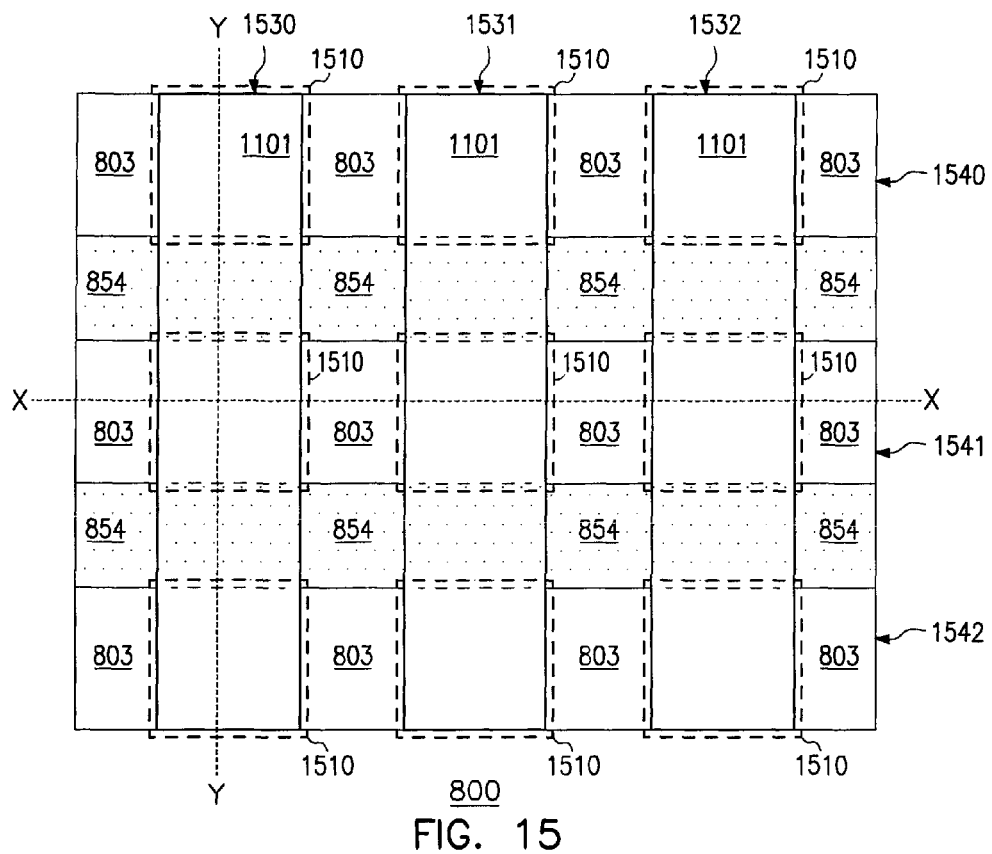
Figure 16:
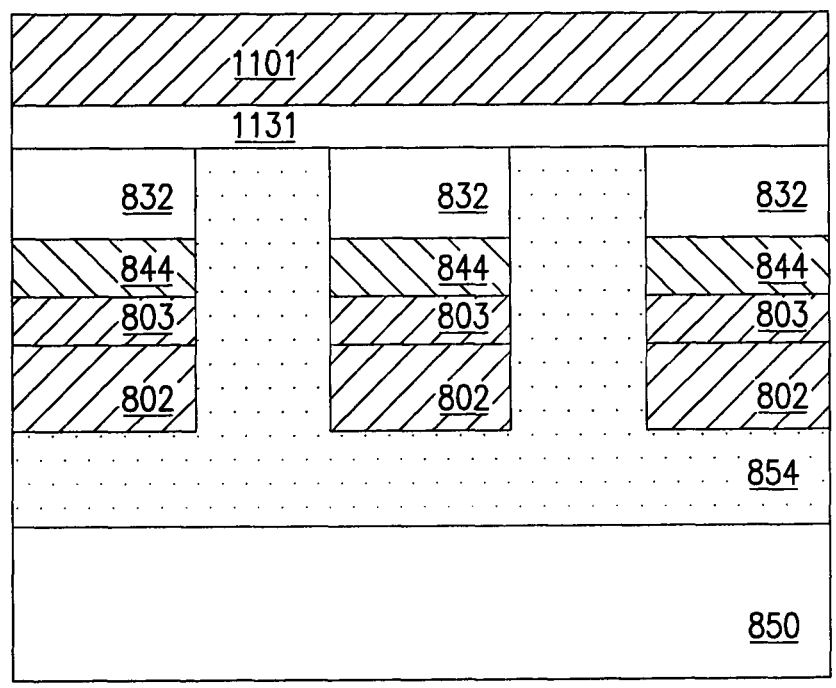

FIG. 14 shows a cross section of memory device 800 after a patterning process has been performed to the materials of components 854, 1101, 1131, 832, and 844, stopping at the material of component 803. FIG. 15 shows a top view of memory device 800 with an X-direction line and a Y-direction line. The cross sections of memory device 800 in FIG. 14 is taken along the X-direction in FIG. 15. FIG. 16 shows another cross section of memory device 800 taken along the Y-direction of FIG. 15.

As shown in FIG. 14, a number of pillars 1410 may be formed after the materials of components 854, 1101, 1131, 832, and 844 are patterned in the patterning process. Patterning the materials to form pillars 1410 may be performed in the same pattering process. For example, the patterning process may include forming a patterned mask or photoresist with openings running along the Y-direction (FIG. 15) over the materials of components 854, 1101, 1131, 832, and 844, and then etching the materials through the openings to form self-aligned structures such as pillars 1410 of FIG. 14. Each of pillars 1410 may form a part of one of a number of memory cells 1510 (FIG. 15). As shown in FIG. 15, memory device 800 may include data/sense lines 1530, 1531, 1532 (e.g., bit lines), each of which includes a part of component 1101 (e.g., electrode) of memory cells 1510 in the same column in the Y-direction line. Memory device 800 may include access lines 1540, 1541, 1542 (e.g., word lines), each of which includes a part of component 803 (e.g., part of an electrode) of memory cells 1410 in the same row in the X-direction line.

Memory cell 1510 of FIG. 15 may include components that are similar or identical to memory cell 410 of FIG. 4. For example, in each pillar 1410 of FIG. 14, component 802 and 803 may form one electrode of memory cell 1510 (FIG. 15), component 1101 may form another electrode of memory cell 1510. Component 1131 may form a dielectric memory cell 1510, component 832 may form an intermediate component of memory cell 1510, and component 844 may form an access component of memory cell 1510.

In some alternative devices, component 832 (intermediate component) of FIG. 8 through FIG. 16 may be omitted, such that dielectric 1101 may be formed directly on component 844. In these alternative devices, memory cell 1510 (without component 832) may include components that are similar or identical to memory cell 310 of FIG. 3.

One or more embodiments described herein include apparatus and methods having a memory cell with a first electrode, a second electrode, and a dielectric located between the first and second electrodes. The dielectric may be configured to allow the memory cell to form a conductive path in the dielectric from a portion of a material of the first electrode to represent a first value of information stored in the memory cell. The dielectric may also be configured to allow the memory cell to break the conductive path to represent a second value of information stored in the memory cell. Other embodiments including additional apparatus methods are described above with reference to FIG. 1 through FIG. 16.

The illustrations of apparatus such as memory devices 200, 600, 700 and 800, and memory cells 310, 410, and 1410 are intended to provide a general understanding of the structure of various embodiments and not a complete description of all the elements and features of the apparatus that might make use of the structures described herein.

The apparatus of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method comprising:
   forming a first electrode of a memory cell, the first electrode comprising a first material;
   forming a second electrode of the memory cell, the second electrode comprising a second material; and
   forming a dielectric material between the first electrode and the second electrode, the dielectric material facilitating forming of a conductive path through the dielectric material to represent a first value of information stored in the memory cell and breaking of the conductive path to represent a second value of information stored in the memory cell, wherein forming the first electrode, the second electrode, and the dielectric material includes:
   forming multiple materials over a substrate, and patterning the multiple materials to form strips of materials, wherein the multiple materials include the second material; and
   after the strips of materials are formed, forming the dielectric material over the strips of materials, forming the first material over the dielectric material, and patterning the first material, the dielectric material, and the strips of materials to form pillars of materials, wherein a first pillar of the pillars of materials includes a portion of one of the strips of materials, a portion of the dielectric material, and a portion of the first material.

2. The method of claim 1, wherein the first material includes one of Ag, Cu, and Au.

3. The method of claim 2, wherein the dielectric material includes one of $Al_xO_y$, MgO, AlN, SiN, $CaO_x$, $NiO_x$, $HfO_2Ta_2O_5$, $ZrO_2$, $NiMnO_x$, $MgF_2$, SiC, $SiO_xN_y$, $HfO_x$, $Nb_2O_5$, $WO_x$, $TiO_x$, $ZrO_x$, and $Cu_xO$.

4. The method of claim 1, further comprising:
   forming an access component between the first electrode and the second electrode, the access component including a third material among the multiple materials, and the third material including a chalcogenide material.

5. The method of claim 4, further comprising:
   forming an intermediate component between the access component and the dielectric material, the intermediate component including a fourth material among the multiple materials, the fourth material of the intermediate component including one of germanium selenide (GeSe) and silver selenide (AgSe).

6. A method comprising:
   forming a first electrode, the first electrode comprising a first material;
   forming a second electrode, the second electrode comprising a second material;
   forming a dielectric material between the first electrode and the second electrode, the dielectric material facilitating forming of a memory element; and
   forming an access component between the dielectric material and the second electrode, such that no portion of the access component is between portions of the dielectric material,
   wherein forming the first electrode, the second electrode, and the dielectric material includes:
   forming multiple materials over a substrate, and patterning the multiple materials to form strips of materials, wherein the multiple materials include the second material; and
   after the strips of materials are formed, forming the dielectric material over the strips of materials, forming the first material over the dielectric material, and patterning the first material, the dielectric material, and the strips of materials to form pillars of materials, wherein a first pillar of the pillars of materials includes a portion of one of the strips of materials, a portion of the dielectric material, and a portion of the first material.

7. The method of claim 6, further comprising forming an intermediate component between the first electrode and the second electrode.

8. The method of claim 7, wherein the dielectric material is formed between the first electrode and the intermediate component.

9. The method of claim 8, wherein the access component is formed such that no portion of the access component is between portions of the dielectric material.

10. The method of claim 8, wherein the dielectric material includes silicon nitride.

11. The method of claim 8, wherein the intermediate component includes one of germanium selenide (GeSe) and silver selenide (AgSe), and the dielectric material includes silicon nitride.

12. The method of claim 11, wherein the first electrode material includes one of silver, copper, and gold.

13. The method of claim 6, wherein the access component includes a chalcogenide material.

14. The method of claim 6, wherein the access component includes one of As—Te—I, $TiAsSe_2$, $TiAsTe_2$, Si—Te—As—Ge, Si—Te—As—Ge—P, Al—As—Te, Al—Ge—As—Te, $Te_{39}As_{36}Si_{17}Ge_7P$, $As_{40}Te_{(60-x)}In_x$ in which $5<x<16.5$, $As_{35}Te_{(65-x)}In_x$ in which $12.5<x<21.5$, $As_{30}Te_{(70-x)}$ in which $12.5<x<21.5$, and $Ge_{20}Te_{(80-x)}Pb_x$, in which $2<x<8$.

15. A method comprising:
   forming a first electrode comprising a first material;
   forming a second electrode comprising a second material;
   forming a memory element including an intermediate component and a dielectric material, wherein the intermediate component is between the first electrode and the second electrode and the dielectric material is between the first electrode and the intermediate component; and
   forming an access component between the memory element and the second electrode, the access component including a metal-insulator-metal diode,
   wherein forming the first electrode, the second electrode and the memory element includes:
   forming multiple materials over a substrate, and patterning the multiple materials to form strips of materials, wherein the multiple materials include the second material; and
   after the strips of materials are formed, forming the dielectric material over the strips of materials, forming the first material over the dielectric material, and patterning the first material, the dielectric material, and the strips of materials to form pillars of materials, wherein a first pillar of the pillars of materials includes a portion of one of the strips of materials, a portion of the dielectric material, and a portion of the first material.

16. The method of claim 15, wherein the dielectric material includes silicon nitride.

17. The method of claim 15, wherein the second electrode includes titanium nitride.

18. The method of claim 17, wherein the second electrode includes a metal material and the titanium nitride is between the metal material and the memory element.

* * * * *